United States Patent
Hadidi et al.

(10) Patent No.: US 11,148,202 B2
(45) Date of Patent: Oct. 19, 2021

(54) SPHEROIDAL DEHYDROGENATED METALS AND METAL ALLOY PARTICLES

(71) Applicant: 6K Inc., North Andover, MA (US)

(72) Inventors: Kamal Hadidi, Somerville, MA (US);
Gregory Wrobel, Boxford, MA (US);
Makhlouf Redjdal, Stoneham, MA (US)

(73) Assignee: 6K Inc., North Andover, MA (US)

( * ) Notice: Subject to any disclaimer, the term of this patent is extended or adjusted under 35 U.S.C. 154(b) by 336 days.

(21) Appl. No.: 15/381,336

(22) Filed: Dec. 16, 2016

(65) Prior Publication Data

US 2017/0173699 A1 Jun. 22, 2017

Related U.S. Application Data

(60) Provisional application No. 62/268,186, filed on Dec. 16, 2015.

(51) Int. Cl.
*C22C 14/00* (2006.01)
*B22F 1/00* (2006.01)
(Continued)

(52) U.S. Cl.
CPC .............. *B22F 9/30* (2013.01); *B22F 1/0003* (2013.01); *B22F 1/0048* (2013.01); *B22F 9/08* (2013.01); *B22F 9/14* (2013.01); *C22C 14/00* (2013.01); *H01J 37/321* (2013.01); *H01J 37/32192* (2013.01); *H05H 1/30* (2013.01);
(Continued)

(58) Field of Classification Search
None
See application file for complete search history.

(56) References Cited

U.S. PATENT DOCUMENTS

| | | | |
|---|---|---|---|
| 1,699,205 | A | 1/1929 | Podszus et al. |
| 2,892,215 | A | 6/1959 | Naeser et al. |

(Continued)

FOREIGN PATENT DOCUMENTS

| | | | |
|---|---|---|---|
| CN | 101716686 A | | 6/2010 |
| CN | 102179521 A | * | 4/2011 |

(Continued)

OTHER PUBLICATIONS

Translation of CN 101716686 (published Jun. 2010) from Espacenet.*

(Continued)

*Primary Examiner* — George Wyszomierski
(74) *Attorney, Agent, or Firm* — Knobbe, Martens, Olson & Bear, LLP

(57) ABSTRACT

Methodologies, systems, and devices are provided for producing metal spheroidal powder products. Dehydrogenated and spheroidized particles are prepared using a process including introducing a metal hydride feed material into a plasma torch. The metal hydride feed material is melted within a plasma in order to dehydrogenate and spheroidize the materials, forming dehydrogenated and spheroidized particles. The dehydrogenated and spheroidized particles are then exposed to an inert gas and cooled in order to solidify the particles into dehydrogenated and spheroidized particles. The particles are cooled within a chamber having an inert gas.

18 Claims, 4 Drawing Sheets

(51) Int. Cl.
  *B22F 9/14* (2006.01)
  *B22F 9/30* (2006.01)
  *H05H 1/42* (2006.01)
  *H05H 1/30* (2006.01)
  *B22F 9/08* (2006.01)
  *H01J 37/32* (2006.01)

(52) U.S. Cl.
  CPC ........... *H05H 1/42* (2013.01); *B22F 2201/10* (2013.01); *B22F 2201/20* (2013.01); *B22F 2202/13* (2013.01); *B22F 2301/205* (2013.01); *B22F 2304/10* (2013.01); *B22F 2998/10* (2013.01); *B22F 2999/00* (2013.01)

(56) References Cited

U.S. PATENT DOCUMENTS

| | | |
|---|---|---|
| 3,293,334 A | 12/1966 | Bylund et al. |
| 3,434,831 A | 3/1969 | Knopp et al. |
| 3,466,165 A | 9/1969 | Rhys et al. |
| RE26,879 E | 5/1970 | Kelso |
| 3,652,259 A | 3/1972 | Knopp |
| 3,802,816 A | 4/1974 | Kaufmann |
| 3,966,374 A | 6/1976 | Honnorat et al. |
| 4,076,640 A | 2/1978 | Forgensi et al. |
| 4,177,026 A | 12/1979 | Honnorat et al. |
| 4,423,303 A | 12/1983 | Hirose et al. |
| 4,431,449 A | 2/1984 | Dillon et al. |
| 4,569,823 A | 2/1986 | Westin |
| 4,599,880 A | 7/1986 | Stepaneko et al. |
| 4,670,047 A | 6/1987 | Kopatz et al. |
| 4,705,560 A | 11/1987 | Kemp et al. |
| 4,711,660 A | 12/1987 | Kemp et al. |
| 4,711,661 A | 12/1987 | Kemp et al. |
| 4,714,587 A | 12/1987 | Eylon et al. |
| 4,731,110 A | 3/1988 | Kopatz et al. |
| 4,731,111 A | 3/1988 | Kopatz et al. |
| 4,778,515 A | 10/1988 | Kemp et al. |
| 4,780,131 A | 10/1988 | Kemp et al. |
| 4,783,216 A | 11/1988 | Kemp et al. |
| 4,783,218 A | 11/1988 | Kemp et al. |
| 4,802,915 A | 2/1989 | Kopatz et al. |
| 4,836,850 A | 6/1989 | Kemp et al. |
| 4,923,509 A | 5/1990 | Kemp et al. |
| 4,943,322 A | 7/1990 | Kemp et al. |
| 4,952,389 A | 8/1990 | Szymanski et al. |
| 5,095,048 A | 3/1992 | Takahashi et al. |
| 5,200,595 A | 4/1993 | Boulos et al. |
| 5,431,967 A | 7/1995 | Manthiram et al. |
| 5,958,361 A | 9/1999 | Laine et al. |
| 5,989,648 A | 11/1999 | Phillips |
| 6,221,125 B1 | 4/2001 | Sode et al. |
| 6,261,484 B1 | 7/2001 | Phillips et al. |
| 6,274,110 B1 | 8/2001 | Kim et al. |
| 6,334,882 B1 | 1/2002 | Aslund |
| 6,409,851 B1 | 6/2002 | Sethuram et al. |
| 6,543,380 B1 | 4/2003 | Sung-Spritzl |
| 6,569,397 B1 | 5/2003 | Yadav et al. |
| 6,589,311 B1 | 7/2003 | Han et al. |
| 6,652,822 B2 | 11/2003 | Phillips et al. |
| 6,676,728 B2 | 1/2004 | Han et al. |
| 6,689,192 B1 | 2/2004 | Phillips et al. |
| 6,755,886 B2 | 6/2004 | Phillips et al. |
| 6,838,072 B1 | 1/2005 | Kong et al. |
| 6,902,745 B2 | 6/2005 | Lee et al. |
| 6,919,527 B2 | 7/2005 | Boulos et al. |
| 7,066,980 B2 | 6/2006 | Akimoto et al. |
| 7,108,733 B2 | 9/2006 | Enokido |
| 7,125,537 B2 | 10/2006 | Liao et al. |
| 7,175,786 B2 | 2/2007 | Celikkaya et al. |
| 7,182,929 B1 | 2/2007 | Singhal et al. |
| 7,220,398 B2 | 5/2007 | Sutorik et al. |
| 7,297,310 B1 | 11/2007 | Peng et al. |
| 7,357,910 B2 | 4/2008 | Phillips et al. |
| 7,374,704 B2 | 5/2008 | Che et al. |
| 7,431,750 B2 | 10/2008 | Liao et al. |
| 7,517,513 B2 | 4/2009 | Sarkas et al. |
| 7,524,353 B2 | 4/2009 | Johnson et al. |
| 7,629,553 B2 | 12/2009 | Fanson et al. |
| 7,700,152 B2 | 4/2010 | Laine et al. |
| 7,931,836 B2 | 4/2011 | Xie et al. |
| 8,043,405 B2 | 10/2011 | Johnson et al. |
| 8,211,388 B2 | 7/2012 | Woodfield et al. |
| 8,268,230 B2 | 9/2012 | Cherepy et al. |
| 8,303,926 B1 | 11/2012 | Luhrs et al. |
| 8,329,090 B2 | 12/2012 | Hollingsworth et al. |
| 8,439,998 B2 | 5/2013 | Ito et al. |
| 8,478,785 B2 | 7/2013 | Jamjoom et al. |
| 8,748,785 B2 | 6/2014 | Jordan et al. |
| 8,840,701 B2 | 9/2014 | Borland et al. |
| 8,951,496 B2 | 2/2015 | Hadidi et al. |
| 9,023,259 B2 | 5/2015 | Hadidi et al. |
| 9,101,982 B2 | 8/2015 | Aslund |
| 9,206,085 B2 | 12/2015 | Hadidi et al. |
| 9,242,224 B2 | 1/2016 | Redjdal et al. |
| 9,259,785 B2 | 2/2016 | Hadidi et al. |
| 9,321,071 B2 | 4/2016 | Jordan et al. |
| 9,421,612 B2 * | 8/2016 | Fang ................... C01B 6/02 |
| 9,630,162 B1 | 4/2017 | Sunkara et al. |
| 9,643,891 B2 | 5/2017 | Hadidi et al. |
| 9,782,791 B2 | 10/2017 | Redjdal et al. |
| 9,782,828 B2 | 10/2017 | Wilkinson |
| 9,796,019 B2 | 10/2017 | She et al. |
| 9,796,020 B2 | 10/2017 | Aslund |
| 9,945,034 B2 | 4/2018 | Yao et al. |
| 9,999,922 B1 | 6/2018 | Struve |
| 10,065,240 B2 | 9/2018 | Chen |
| 10,130,994 B2 | 11/2018 | Fang et al. |
| 10,350,680 B2 | 7/2019 | Yamamoto et al. |
| 10,639,712 B2 | 5/2020 | Barnes et al. |
| 2002/0112794 A1 | 8/2002 | Sethuram et al. |
| 2003/0077398 A1 | 4/2003 | Strutt et al. |
| 2003/0172772 A1 | 9/2003 | Sethuram et al. |
| 2003/0196513 A1 | 10/2003 | Phillips et al. |
| 2004/0009118 A1 | 1/2004 | Phillips et al. |
| 2004/0022939 A1 | 2/2004 | Kim et al. |
| 2004/0045807 A1 | 3/2004 | Sarkas et al. |
| 2004/0123699 A1 | 7/2004 | Liao et al. |
| 2004/0183008 A1 | 9/2004 | Wiseman |
| 2005/0025698 A1 | 2/2005 | Talbot et al. |
| 2005/0163696 A1 | 7/2005 | Uhm et al. |
| 2005/0242070 A1 | 11/2005 | Hammer |
| 2006/0145124 A1 | 7/2006 | Hsiao et al. |
| 2007/0075052 A1 | 4/2007 | Fanson et al. |
| 2007/0089860 A1 | 4/2007 | Hou et al. |
| 2007/0130656 A1 | 6/2007 | Boulos et al. |
| 2007/0259768 A1 | 11/2007 | Kear et al. |
| 2008/0006954 A1 | 1/2008 | Yubuta et al. |
| 2008/0173641 A1 | 7/2008 | Hadidi et al. |
| 2009/0074655 A1 | 3/2009 | Suciu |
| 2009/0093553 A1 | 4/2009 | Jager et al. |
| 2009/0155689 A1 | 6/2009 | Zaghib et al. |
| 2010/0086853 A1 | 4/2010 | Venkatachalam et al. |
| 2010/0176524 A1 | 7/2010 | Burgess et al. |
| 2012/0027955 A1 | 2/2012 | Sunkara et al. |
| 2012/0077082 A1 | 3/2012 | Se-Hee et al. |
| 2012/0272788 A1 | 11/2012 | Withers |
| 2012/0294919 A1 | 11/2012 | Jaynes et al. |
| 2012/0322645 A1 | 12/2012 | Jordan et al. |
| 2013/0071284 A1 * | 3/2013 | Kano ................... C22C 14/00 |
| | | 419/30 |
| 2013/0270261 A1 | 10/2013 | Hadidi et al. |
| 2013/0284325 A1 * | 10/2013 | Lee ................... C22C 14/00 |
| | | 148/670 |
| 2013/0315773 A1 | 11/2013 | Moxson et al. |
| 2014/0131906 A1 | 5/2014 | Hadidi et al. |
| 2014/0155249 A1 | 6/2014 | Hadidi et al. |
| 2014/0202286 A1 | 7/2014 | Yokoyama et al. |
| 2014/0217630 A1 | 8/2014 | Redjdal et al. |
| 2014/0287162 A1 | 9/2014 | Jordan et al. |
| 2014/0328724 A1 | 11/2014 | Chen |
| 2014/0373344 A1 | 12/2014 | Takada et al. |
| 2017/0113273 A1 | 4/2017 | Fang et al. |
| 2017/0120339 A1 | 5/2017 | Aslund |

(56) References Cited

U.S. PATENT DOCUMENTS

| | | | |
|---|---|---|---|
| 2017/0151609 A1 | 6/2017 | Eisen et al. | |
| 2017/0173699 A1 | 6/2017 | Hadidi et al. | |
| 2017/0209908 A1 | 7/2017 | Smathers et al. | |
| 2017/0209963 A1 | 7/2017 | Smathers et al. | |
| 2017/0252854 A1 | 9/2017 | Maier et al. | |
| 2017/0368602 A1 | 12/2017 | She et al. | |
| 2017/0368604 A1 | 12/2017 | Wilkinson et al. | |
| 2017/0373344 A1 | 12/2017 | Hadidi et al. | |
| 2018/0126464 A1 | 5/2018 | Hadidi et al. | |
| 2018/0297122 A1 | 10/2018 | Hadidi et al. | |
| 2018/0301280 A1 | 10/2018 | Nishisaka | |
| 2018/0361500 A1 | 12/2018 | Aleksandrov et al. | |
| 2019/0001416 A1 | 1/2019 | Larouche et al. | |
| 2019/0217389 A1 | 7/2019 | Parrish et al. | |
| 2019/0218650 A1 | 7/2019 | Subramanian et al. | |
| 2020/0203706 A1 | 6/2020 | Holman et al. | |
| 2020/0215606 A1 | 7/2020 | Barnes et al. | |

FOREIGN PATENT DOCUMENTS

| | | | |
|---|---|---|---|
| CN | 102554242 B | * | 2/2012 |
| CN | 102554242 B | | 12/2013 |
| CN | 104084592 A | | 10/2014 |
| CN | 104209526 A | | 12/2014 |
| CN | 104772473 A | * | 7/2015 |
| EP | 0256233 A2 | | 2/1988 |
| EP | 3474978 A4 | | 5/2019 |
| WO | WO 2011/082596 A1 | | 7/2011 |
| WO | WO 2015/174949 A1 | | 11/2015 |
| WO | WO 2016/048862 A1 | | 3/2016 |
| WO | WO 2017/106601 A1 | | 6/2017 |
| WO | WO 2017/177315 A1 | | 10/2017 |
| WO | WO 2017/223482 A1 | | 12/2017 |
| WO | WO2019/139773 | | 7/2019 |
| WO | WO 2019/243870 | | 12/2019 |
| WO | WO 2019/246242 | | 12/2019 |
| WO | WO 2019/246257 | | 12/2019 |
| WO | WO 2020/132343 | | 6/2020 |

OTHER PUBLICATIONS

Translation of CN-102179521 (published Apr. 2011) from Espacenet.*
Translation of CN 102554242 (published Feb. 2012) from Espacenet.*
Translation of CN 104772473 (published Jul. 2015) from Espacenet.*
Zhang, K., Ph.D. thesis entitled "The Microstructure and Properties of Hipped Powder Ti Alloys", University of Birmingham, College of Engineering and Physical Sciences, Apr. 2009.*
Reig, L. et al., "Microstructure and Mechanical Behavior of Porous Ti—6Al—4V Processed by Spherical Powder Sintering", Materials, vol. 6, pp. 4868-4878, Published Oct. 23, 2013.*
Carreon, H. et al., "Study of Aging Effects in a Ti—6Al—4V alloy with Widmanstatten and Equiaxed Microstructures by Nondestructive Means", AIP Conference Proceedings 1581, 739 (2014), Published online Feb. 17, 2015.*
International Search Report and Written Opinion of the International Searching Authority relating to corresponding application No. PCT/IB2018/54523, completed on Oct. 22, 2018 and dated Nov. 2, 2018.
Notification of Transmittal of the International Search Report and The Written Opinion of the International Searching Authority issued for PCT/US16/67100 dated Feb. 9, 2017 and dated Mar. 22, 2017.
Dolbec, Richard, "Recycling Spherical Powders," Presented at Titanium 2015, Orlando, FL, Oct. 2015.
J. H. Van Laar et al, "Spheroidisation of Iron Powder in a Microwave Plasma Reactor", Journal of the Southern African Institute of Mining and Metallurgy, vol. 116, No. 10, pp. 941-946, Oct. 2016.
V. I. Kotlyarov et al, "Production of Spherical Powders on the Basis of Group IV Metals for Additive Manufacturing", Inorganic Materials: Applied Research, Pleiades Publishing, vol. 8, No. 3, pp. 452-458, May 2017.
Boulos, M., "Induction Plasma Processing of Materials for Powders, Coating, and Near-Net-Shape Parts", Advanced Materials & Processes, Aug. 2011.
Jian-Jun Wang et al: "Preparation of Spherical Tungsten and Titanium Powders by RF Induction Plasma Processing," Rare Metals, vol. 34, No. 6, May 31, 2014, pp. 431-435.
International Search Report and Written Opinion of the International Searching Authority relating to corresponding Application No. PCT/US17/39049, completed on Aug. 31, 2017 and dated Oct. 31, 2017.
Babajide Patrick Ajayi et al.: "A rapid and scalable method for making mixed metal oxide alloys for enabling accelerated materials discovery",Journal of Materials Research, vol. 31, No. 11, Mar. 28, 2016 (Mar. 28, 2016), pp. 1596-1607.
Boulos, M. I., "The inductively coupled radio frequency plasma." Journal of High Temperature Material Process, Jan. 1997, vol. 1, pp. 17-39.
Ivasishin, et al., "Innovative Process for Manufacturing Hydrogenated Titanium Powder for Solid State Production of R/M Titanium Alloy Components" Titanium 2010, Oct. 2010, 27 pages.
Laine, R. M. et al., "Making nanosized oxide powders from precursors by flame spray pyrolysis." Key Engineering Materials, May 1998, v 159-160, p. 17-24.
Muoto, C. et al., "Phase Homogeneity in Y2O3—MgO Nanocomposites Synthesized by Thermal Decomposition of Nitrate Precursors with Ammonium Acetate Additions" J. Am. Ceram. Soc., Aug. 2011, 94[12] 4207-4217.
Veith et al., "Low temperature synthesis of nanocrystalline Y3Al5O12 (YAG) and Cedoped Y3Al5O12 via different sol-gel methods." J. Mater Chem, Jan. 9, 1999: 3069-3079.
Yang et al., "Preparation of Spherical Titanium Powders from Polygonal Titanium Hydride Powders by Radio Frequency Plasma Treatment" Materials Transactions, vol. 54, No. 12, Nov. 2013, pp. 2313 to 2316.
Suryanarayana, "Recent Developments in Mechanical alloying" Reviews on Advanced Materials Science 18(3):203-211. Aug. 2008.
Chikumba et al., "High Entropy Alloys: Development and Applications" 7th International Conference on Latest Trends in Engineering & Technology (ICLTET'2015) Nov. 26-27, 2015 Irene, Pretoria (South Africa).
Edward K. Nyutu et al: "Ultrasonic Nozzle Spray in Situ Mixing and Microwave-Assisted Preparation of Nanocrystalline Spinel Metal Oxides: Nickel Ferrite and Zinc Aluminate", Journal of Physical Chemistry C, vol. 112, No. 5, Feb. 1, 2008 (Feb. 1, 2008), pp. 1407-1414.
Popescu et al.. "New TiZrNbTaFe high entropy alloy used for medical applications" IOP Conference Series: Materials Science and Engineering 400. Mod Tech 2018, Jan. 2018, 9 pages.
He et al., "A precipitation-hardened high-entropy alloy with outstanding tensile properties" Acta Materialia 102, Jan. 2016, pp. 187-196.
International Preliminary Reporton Patentability and Written Opinion in PCT/US2019/037979 dated Aug. 22, 2019.
Shih-Min Chang et al: "One-Step Fast Synthesis of Li4Ti5O12 Particles Using an Atmospheric Pressure Plasma Jet", Journal of the American Ceramic Society., vol. 97, No. 3, Dec. 26, 2013 (Dec. 26, 2013), pp. 708-712.
Supplementary European Search Report for application No. 17816316.8 which in an EP application related to the present application, dated Jan. 22, 2020.
Y. Sheng et. al: "Preparation of Micro-spherical Titanium Powder by RF Plasma," Rare Metal Materials and Engineering, vol. 42, No. 6, Jun. 2013, pp. 1291-1294.
Y. Sheng et. al: "Preparation of Spherical Tungsten Powder by RF Induction Plasma," Rare Metal Materials and Engineering, vol. 40, No. 11, Nov. 2011, pp. 2033-2037.
Chen, G. et al., "Spherical Ti—6Al—4V Powders Produced by Gas Atomization", Key Engineering Materials, vol. 704, Aug. 2016, pp. 287-292. URL: https://www.scientific.net/KEM.704.287.
Lin, M., "Gas Quenching with Air Products' Rapid Gas Quenching Gas Mixture", Air Products, Dec. 31, 2007, in 4 pages. URL:

(56) References Cited

OTHER PUBLICATIONS https://www.airproducts.co.uk/-/media/airproducts/files/en/330/330-07-085-US-gas-quenching-with-air-products-rapid-gas-quenching-gas-mixture.pdf.

International Preliminary Report on Patentability and Written Opinion of the International Searching Authority relating to PCT/US2016/067100 dated Jun. 19, 2018 and dated Jun. 28, 2018.

Notification of Transmittal of the International Search Report and Written Opinion of the International Searching Authority relating to PCT/US2019/037956 dated Sep. 24, 2019 and dated Oct. 1, 2019.

* cited by examiner

SPHEROIDAL DEHYDROGENATED METALS AND METAL ALLOY PARTICLES

RELATED APPLICATIONS

This application claims priority to and the benefit of U.S. Provisional Patent Application No. 62/268,186, filed Dec. 16, 2015, which is incorporated herein by reference in its entirety.

TECHNICAL FIELD

The present disclosure is generally directed towards producing metal spheroidal powder products. More particularly, the present disclosure is directed towards techniques for producing metal spheroidal powder products using a microwave generated plasma.

BACKGROUND

An important aspect of preparing some forms of industrial powders is the spheroidization process, which transforms irregularly shaped or angular powders produced by conventional crushing methods, into spherical low-porosity particles. Spherical powders are homogenous in shape, denser, less porous, and have a high and consistent flowability. Such powders exhibit superior properties in applications such as injection molding, thermal spray coatings, additive manufacturing, etc.

Conventional spheroidization methods employ thermal arc plasma described in U.S. Pat. No. 4,076,640 issued Feb. 28, 1978 and radio-frequency generated plasma described in U.S. Pat. No. 6,919,527 issued Jul. 19, 2005. However, these two methods present limitations inherent to the thermal non-uniformity of radio-frequency and thermal arc plasmas.

In the case of thermal arc plasma, an electric arc is produced between two electrodes generates a plasma within a plasma channel. The plasma is blown out of the plasma channel using plasma gas. Powder is injected from the side, either perpendicularly or at an angle, into the plasma plume, where it is melted by the high temperature of the plasma. Surface tension of the melt pulls it into a spherical shape, then it is cooled, solidified and is collected in filters. An issue with thermal arc plasma is that the electrodes used to ignite the plasma are exposed to the high temperature causing degradation of the electrodes, which contaminates the plasma plume and process material. In addition, thermal arc plasma plume inherently exhibit large temperature gradient. By injecting powder into the plasma plume from the side, not all powder particles are exposed to the same process temperature, resulting in a powder that is partially spheroidized, non-uniform, with non-homogeneous porosity.

In the case of radio-frequency inductively coupled plasma spheroidization, the plasma is produced by a varying magnetic field that induces an electric field in the plasma gas, which in turn drives the plasma processes such as ionization, excitation, etc . . . to sustain the plasma in cylindrical dielectric tube. Inductively coupled plasmas are known to have low coupling efficiency of the radio frequency energy into the plasma and a lower plasma temperature compared to arc and microwave generated plasmas. The magnetic field responsible for generating the plasma exhibits a non-uniform profile, which leads to a plasma with a large temperature gradient, where the plasma takes a donut-like shape that exhibiting the highest temperature at the edge of the plasma (close to the dielectric tube walls) and the lowest temperature in the center of the donut. In addition, there is a capacitive component created between the plasma and the radio frequency coils that are wrapped around the dielectric tube due to the RF voltage on the coils. This capacitive component creates a large electric field that drives ions from the plasma towards the dielectric inner walls, which in turn leads to arcing and dielectric tube degradation and process material contamination by the tube's material.

To be useful in additive manufacturing or powdered metallurgy (PM) applications that require high powder flow, metal powder particles should exhibit a spherical shape, which can be achieved through the process of spheroidization. This process involves the melting of particles in a hot environment whereby surface tension of the liquid metal shapes each particle into a spherical geometry, followed by cooling and re-solidification. In one such technique, a plasma rotating electrode (PRP) produces high flowing and packing titanium and titanium alloy powders but is deemed too expensive. Also, spheroidized titanium and titanium alloys have been produced using gas atomization, which uses a relatively complicated set up. Other spheroidization methods include TEKNA's (Sherbrook, Quebec, Canada) spheroidization process using inductively coupled plasma (ICP), where angular powder obtained from Hydride-Dehydride (HDH) process is entrained within a gas and injected though a hot plasma environment to melt the powder particles. However, this method suffers from non uniformity of the plasma, which leads to incomplete spheroidization of feedstock. The HDH process involves several complex steps, including hydrogenation dehydrogenation, and deoxydation before the powder is submitted to spheroidization. This process is a time consuming multi-step process, which drives up the cost of metal powders made through these methods.

From the discussion above, it is therefore seen that there exists a need in the art to overcome the deficiencies and limitations described herein and above.

SUMMARY

The shortcomings of the prior art are overcome and additional advantages are provided through the use of a microwave generated plasma torch apparatus that is capable of simultaneously spheroidizing and dehydrogenating metal and metal alloy particles. Exemplary embodiments of the present technology are directed to spheroidal dehydrogenated metal and metal alloy particles, and systems, devices, and methods for preparing such particles.

In one aspect, the present disclosure relates to dehydrogenated and spheroidized particles. The dehydrogenated and spheroidized particles are prepared according to a process including: introducing a metal hydride feed material into a plasma torch (e.g., a microwave generated plasma torch, a Radio Frequency inductively coupled plasma torch); melting, dehydrogenating, and spheroidizing the feed material within the plasma to form dehydrogenated and spheroidized particles; exposing the dehydrogenated and spheroidized particles to an inert gas; and cooling and solidifying the dehydrogenated and spheroidized particles in a chamber having the inert gas.

Embodiments of the above aspect may include one or more of the following features. For example, an embodiment may further include deoxidizing the dehydrogenated and spheroidized particles within the plasma. In certain embodiments, the metal hydride feed material can be formed of titanium hydride materials, and the dehydrogenated and spheroidized particles are spherical titanium powder particles. In another embodiment, the metal hydride feed material can be formed of titanium alloy hydride materials, and the dehyrogenated and spheroidized particles are spherical titanium alloy powder particles. In particular, the titanium alloy powder particles are Ti AL6-V4 with between 4% to 7% weight aluminum and 3% to 5% weight vanadium. In one embodiment, the feed material is exposed to a partial vacuum within the plasma. In another embodiment, the feed material is exposed to a pressure greater than atmospheric pressure within the plasma. In an embodiment, the feed material is exposed to a temperature profile between about 4,000 K and 8,000 K within the plasma. In certain embodiments, the feed material is screened prior to introducing them into the plasma torch. In some embodiments, the feed material is screened such that a particle size of the feed material is no less than 1.0 micrometers and no more than 300 micrometers. In certain embodiments, the metal hydride feed material is continuously introduced into the plasma torch at a predetermined rate. In some embodiments, the metal hydride feed material is purged with an inert gas prior to introducing the feed material into the plasma torch.

In another aspect, the present disclosure relates to a method of producing metal or metal alloy powders. The method includes; introducing a metal hydride feed material into a plasma torch (e.g., a microwave generated plasma torch, a Radio Frequency inductively coupled plasma torch); directed the feed material toward a plasma within the plasma torch; melting, dehydrogenating and spheroidizing the feed material within the plasma; directing the dehydrogenated and spheroidized particles from the plasma to a chamber having an inert gas; cooling and solidifying the dehydrogenated and spheroidized particles in the chamber having the inert gas; and collecting the dehydrogenated and spheroidized particles.

Embodiments of the above aspect may include one or more of the following features. For example, the method of producing metal or metal alloy powders can further include a step of deoxidizing the feed material within the plasma. In some embodiments, the metal hydride feed material comprises titanium hydride materials, and the dehydrogenated and spheroidized particles are spherical titanium spherical titanium powder particles. In certain embodiments, the metal hydride feed material comprises titanium alloy hydride materials, and the dehydrogenated and spheroidized particles are spherical titanium spherical titanium alloy powder particles. In particular, the titanium alloy powder particles are Ti AL6-V4, with between 4% to 7% weight aluminum and 3% to 5% weight vanadium. In one embodiment, the feed material is exposed to a partial vacuum within the plasma. In another embodiment, the feed material is exposed to a pressure greater than atmospheric pressure within the plasma. In an embodiment, the feed material is exposed to a temperature profile between about 4,000 K and 8,000 K within the plasma. In certain embodiments, the feed material is screened prior to introducing them into the plasma torch. In some embodiments, the feed material is screened such that a particle size of the feed material is no less than 1.0 micrometers and no more than 300 micrometers. In certain embodiments, the metal hydride feed material is continuously introduced into the plasma torch at a predetermined rate. In some embodiments, the metal hydride feed material is purged with an inert gas prior to introducing the feed material into the plasma torch. In certain embodiments, the method of producing metal or metal alloy powders can further include a step of directing the dehydrogenated, deoxidized, and spheroidized particles to a hermetically sealed collection bin.

The various dehydrogenated and spheroidized particles, processes used to create the dehydrogenated and spheroidized particles, and methods of producing metal or metal allow powders in accordance with the present technology can provide a number of advantages. For example, the particles, processes for forming the particles and methods disclosed herein can be used in a continuous process that simultaneously dehydrogenates, spheroidizes, and in some embodiments deoxidizes feed materials. That is, the separate and distinct steps of dehydrogenation, deoxydation, and spheroidization steps required in an HDH prior art process can be eliminated in favor of a single processing step using a plasma (e.g., microwave generated plasma, a RF generated plasma). Such embodiments can reduce the cost of spheroidizing metal powders by reducing the number of processing steps, which in turn, reduces the energy per unit volume of processed material and can increase the consistency of the final product. Reduction in the number of processing steps also reduces the possibility for contamination by oxygen and other contaminants. Additionally, the continuous dehydrogenation processes disclosed herein improves the consistency of the end products by reducing or eliminating variations associated with typical batch-based dehydrogenation processes. The present technology can achieve additional improvements in consistency due to the homogeneity and control of the energy source (i.e., plasma process). Specifically, if the plasma conditions are well controlled, particle agglomeration can be reduced, if not totally eliminated, thus leading to a better particle size distribution (on the same scale as the original feed materials).

Additional features and advantages are realized through the techniques of the present technology. The recitation herein of desirable objects or aspects which are met by various embodiments of the present technology is not meant to imply or suggest that any or all of these objects or aspects are present as essential features, either individually or collectively, in the most general embodiment of the present technology or in any of its more specific embodiments.

BRIEF DESCRIPTION OF THE DRAWINGS

The features and advantages of the present disclosure will be more fully understood from the following description of exemplary embodiments when read together with the accompanying drawings, in which.

DETAILED DESCRIPTION

Figure 1:
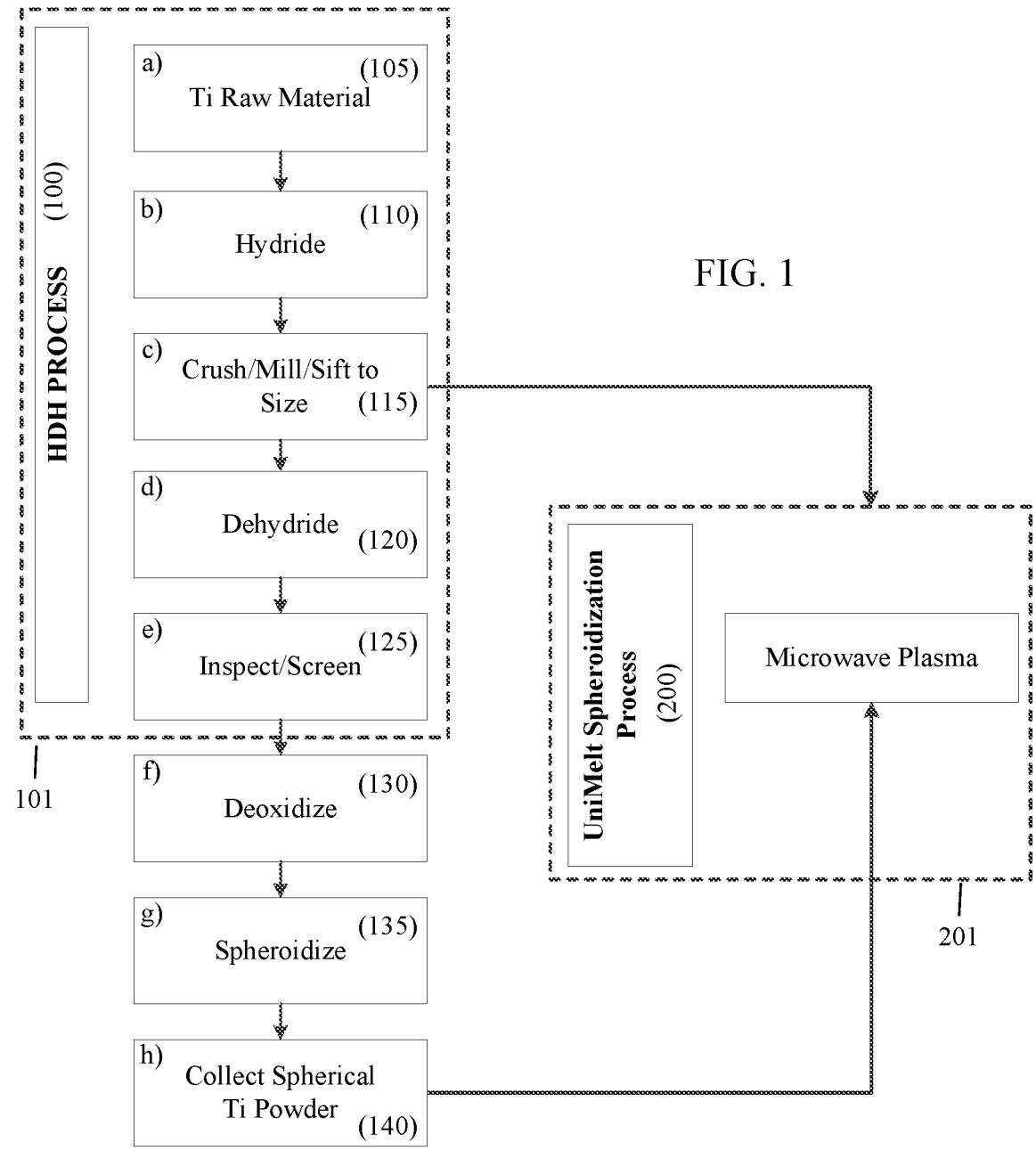
FIG. 1 illustrates an example method of producing spheroidal metallic and metallic alloy particles according to the present disclosure, compared against a conventional method for producing similar particles.

One aspect of the present disclosure involves a process of spheroidization of metals and metal alloy hydrides using a microwave generated plasma. The process uses readily available existing pre-screened or non-prescreened raw materials made of metal hydrides as feedstock. The powder feedstock is entrained in inert and/or reducing and/or oxidizing gas environment and injected into the microwave plasma environment. Upon injection into a hot plasma, the feedstock is simultaneously dehydrogenated and spheroidized and released into a chamber filled with an inert gas and directed into hermetically sealed drums where is it stored. This process can be carried out at atmospheric pressure, in a partial vacuum, or at a slightly higher pressure than atmospheric pressure. In alternative embodiments, the process can be carried out in a low, medium, or high vacuum environment. The process can run continuously and the drums are replaced as they fill up with spheroidized dehydrogenated and deoxydated metal or metal alloy particles. The process not only spheroidizes the powders, but also eliminates the dehydrogenation and deoxydation steps from the traditional process of manufacturing metal and metal alloy powders using Hydride-De-hydride (HDH) process, which leads to cost reduction. By reducing the number of processing steps and providing a continuous process, the possibilities for contamination of the material by oxygen and other contaminants is reduced. Furthermore, provided the homogeneity of the microwave plasma process, particle agglomeration is also reduced, if not totally eliminated, thus leading to at least maintaining the particle size distribution of the original hydride feed materials.

In the powdered metallurgy industry, the Hydride-Dehydride (HDH) process is used to resize large metallic or metallic alloy pieces down to a finer particle size distribution through crushing, milling, and screening. Metal and alloy powders are manufactured using the HDH process, where bulk feedstock, such as coarse metal powders or metal/metal alloy scraps, etc., are heated in a hydrogen-containing atmosphere at high temperature (~700° C.) for a few days. This leads to the formation of a brittle metal hydride, which can readily be crushed into a fine power and sifted to yield a desired size distribution determined by the end user. To be useful in powdered metallurgy, hydrogen must be dissociated and removed from the metal by heating the metal hydride powder within vacuum for a period of time. The dehydrogenated powder must then be sifted to remove large particle agglomerations generated during process due to sintering. The typical resulting powder particles have an irregular or angular shape. The powder is submitted to a deoxydation process to remove any oxygen picked up by the powder during sifting and handling. Conventional HDH processes produce only coarse and irregular shaped particles. Such HDH processes must be followed by a spheroidization process to make these particles spheroidal.

Conventional HDH processes are primarily carried out as solid-state batch processes. Typically, a volume of metal hydride powder is loaded into a crucible(s) within a vacuum furnace. The furnace is pumped down to a partial vacuum and is repeatedly purged with inert gas to eliminate the presence of undesired oxygen. Diffusion of the inert gas through the open space between the powder particles is slow making it difficult to fully eliminate oxygen, which otherwise contaminates the final product. Mechanical agitation may be used to churn powder allowing for more complete removal of oxygen. However, this increases the complexity of the system and the mechanical components require regular maintenance, ultimately increasing cost.

Following oxygen purging the, hydrogenation may begin. The furnace is filled with hydrogen gas and heated up to a few days at high temperature to fully form the metal hydride. The brittle nature of the metal hydride allows the bulk material to be crushed into fine powders which are then screened into desired size distributions.

The next step is dehydrogenation. The screen hydride powder is loaded into the vacuum furnace then heated under partial vacuum, promoting dissociation of hydrogen from the metal hydride to form $H_2$ gas and dehydrided metal. Dehydrogenation is rapid on the particle surface where $H_2$ can readily leave the particles. However, within the bulk of the powder, $H_2$ must diffuse through the bulk of the solid before it reaches surface and leave the particle. Diffusion through the bulk is a rate-limiting process "bottle-neck" requiring relatively long reaction time for complete dehydrogenation. The time and processing temperatures required for dehydrogenation are sufficient to cause sintering between particles, which results in the formation of large particle agglomerations in the final product. Post-process sifting eliminates the agglomerations, which adds process time and cost to the final product. Before the powder can be removed from the furnace, it must be sufficiently cooled to maintain safety and limit contamination. The thermal mass of the large furnaces may take many hours to sufficiently cool. The cooled powders must then be spheroidized in a separate machine. Generally this is carried out within an RF plasma, which are known to exhibit large temperature gradients resulting in partially spheroidized products.

Techniques are disclosed herein for manufacturing spheroidal metal and metal alloy powder products in a continuous process that simultaneously dehydrogenates, spheroidizes, and deoxidizes feed materials. According to exemplary embodiments, the dehydrogenation, deoxydation, and spheroidization steps of an HDH process can be eliminated in favor of a single processing step using a microwave generated plasma. Such embodiments can reduce the cost of spheroidizing metal powders by reducing the number of processing steps, reducing the energy per unit volume of processed material, and increasing the consistency of the final product. Reduction in the number of processing steps also reduces the possibility for powder contamination by oxygen and other contaminants. Additionally, the continuous dehydrogenation processes disclosed herein improves the consistency of the end products by reducing or eliminating variations associated with typical batch-based dehydrogenation processes.

The rate of cooling of the dehydrogenated, deoxidized, and spheroidized metal and metal alloys can be controlled to strategically influence the microstructure of the powder. For example, rapid cooling of α-phase titanium alloys facilitates an acicular (martensite) structure. Moderate cooling rates produce a Widmanstätten microstructure, and slow cooling rates form an equiaxed microstructure. By controlling the process parameters such as cooling gas flow rate, residence time, etc., microstructure of the metal and metal alloys can be controlled. The precise cooling rates required to form these structures is largely a function of the type and quantity of the alloying elements within the material.

In one exemplary embodiment, inert gas is continually purged surrounding a powdered metal hydride feed to remove oxygen within a powder-feed hopper. A continuous volume of powder feed is then entrained within an inert gas and fed into the microwave generated plasma for dehydrogenation. In one example, the microwave generated plasma may be generated using a microwave plasma torch, as described in U.S. Patent Publication No. US 2013/0270261, and/or U.S. Patent Publication No. US 2008/0173641 (issued as U.S. Pat. No. 8,748,785), each of which is hereby incorporated by reference in its entirety. In some embodiments, the particles are exposed to a uniform temperature profile at between 4,000 and 8,000 K within the microwave generated plasma. Within the plasma torch, the powder particles are rapidly heated and melted. Liquid convection accelerates H₂ diffusion throughout the melted particle, continuously bringing hydrogen (H₂) to the surface of the liquid metal hydride where it leaves the particle, reducing the time each particle is required to be within the process environment relative to solid-state processes. As the particles within the process are entrained within an inert gas, such as argon, generally contact between particles is minimal, greatly reducing the occurrence of particle agglomeration. The need for post-process sifting is thus greatly reduced or eliminated, and the resulting particle size distribution could be practically the same as the particle size distribution of the input feed materials. In exemplary embodiments, the particle size distribution of the feed materials is maintained in the end products.

Within the plasma, the melted metals are inherently spheroidized due to liquid surface tension. As the microwave generated plasma exhibits a substantially uniform temperature profile, more than 90% spheroidization of particles could be achieved (e.g., 91%, 93%, 95%, 97%, 99%, 100%), eliminating the need for separate dehydrogenation and deoxydation steps. After exiting the plasma, the particles are cooled before entering collection bins. When the collection bins fill, they can be removed and replaced with an empty bin as needed without stopping the process.

Referring to FIG. 1, shown is a comparison of a conventional process for producing spheroidized titanium powder (100) versus a method (200) in accordance with the present technology. The process flow (101) on the left of FIG. 1 presents an example process that combines a HDH process (100) with spheroidization of titanium powders. The process starts with Ti raw material (step a, 105) that is hydrogenated (step b, 110), and then crushed and sifted to size (step c, 115). Pure titanium is recovered through dehydrogenation (step d, 120). It is then screened for agglomerations and impurities, then sifted to the size specified by the customer (step e, 125). The powder then goes through a deoxidation step to reduce or eliminate oxygen that it picked up during the sifting and screening processes. Deoxidation is required especially for small particle sizes, such as particles below 50 microns, where the surface to volume ratio is substantial (step f, 130). The titanium particles are then spheroidized (step g, 135) and collected (step h, 140). A similar process can be used to create a Ti alloy, such as Ti 6-4, instead of pure titanium powder.

As discussed above, embodiments of the present disclosure combine the dehydrogenation, deoxydation, and spheroidization steps shown on the left side of FIG. 1 (101, 130, 135) in favor of a single step to produce spheroidized metals and/or metal alloys from corresponding hydride feedstock. An example of this technique is illustrated in the process flow (201) shown on the right side of FIG. 1. The method starts with a crushed and sifted metal hydride feed material (i.e., step c, 115, without performing the dehydride step). In this particular embodiment, the feed material is a titanium hydride powder, and the powder resulting from process 200 is a spherical titanium powder. (It is noted that process 200 can also be used with crushed and sifted metal alloy hydride feed material, such as titanium alloy hydride feed material, and the powder resulting from completion of process 200 is a spherical metal alloy powder, such as a spherical titanium alloy powder.) The powder is entrained within an inert gas and injected into a microwave generated plasma environment exhibiting a substantially uniform temperature profile between approximately 4,000 K and 8,000 K and under a partial vacuum. The hermetically sealed chamber process can also run at atmospheric pressure or slightly above atmospheric pressure to eliminate any possibility for atmospheric oxygen to leak into the process. The particles are simultaneously melted and dehydrogenated in the plasma, spheroidized due to liquid surface tension, re-solidifying after exiting the plasma (200). The particles are then collected in sealed drums in an inert atmosphere (140). Within the plasma, the powder particles are heated sufficiently to melt and cause convection of the liquid metal, causing dissociation of the hydrogen according to the reversible reaction where M=an arbitrary metal:

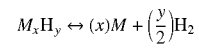

Within the partial vacuum, dissociation of hydrogen from the metal to form hydrogen gas is favored, driving the above reaction to the right. The rate of dissociation of hydrogen from the liquid metal is rapid, due to convection, which continually introduces H₂ to the liquid surface where it can rapidly leave the particle.

Figure 2:
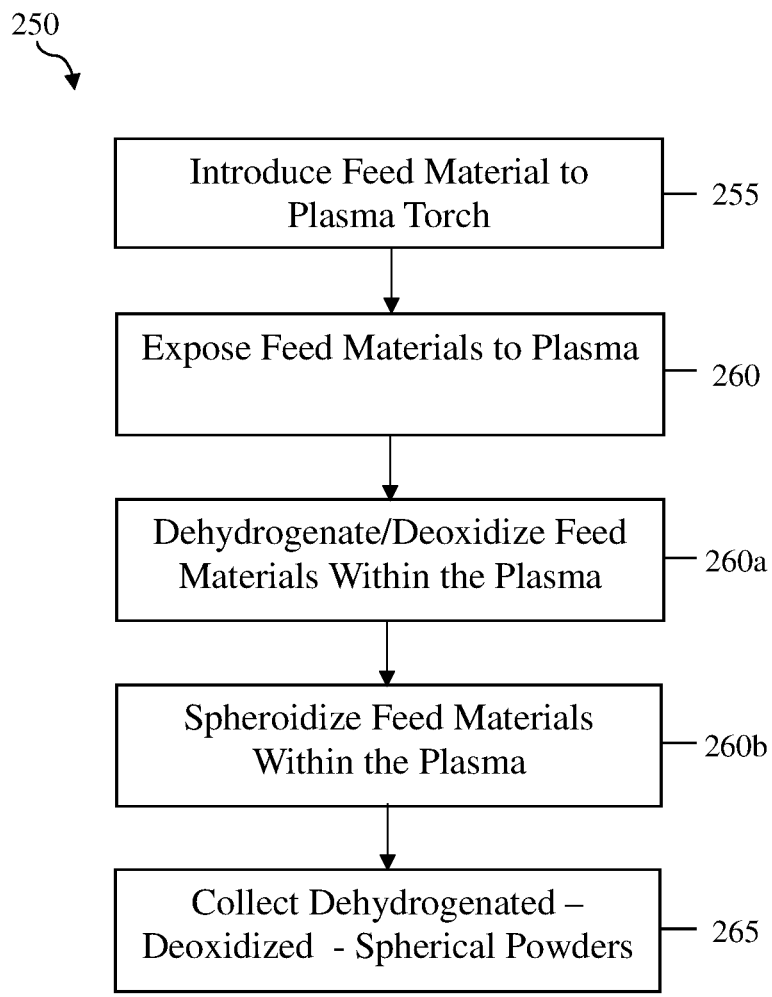
FIG. 2 illustrates another example method of producing dehydrogenated spheroidal particles according to the present disclosure.

FIG. 2 is a flow chart illustrating an exemplary method (250) for producing spherical powders, according to an embodiment of the present disclosure. In this embodiment, the process (250) begins by introducing a feed material into a plasma torch (255). In some embodiments, the plasma torch is a microwave generated plasma torch or an RF plasma torch. Within the plasma torch, the feed materials are exposed to a plasma causing the materials to melt, as described above (260). During the same time (i.e., time that feed material is exposed to plasma), hydrogen within the feed material dissociates from the metal, resulting in dehydrogenation (260a). Simultaneously the melted materials are spheroidized by surface tension, as discussed above (260b). Note that the step 260 includes 260a and 260b. That is, by exposing the feed material to the plasma both dehydrogenation and spheroidization are achieved; no separate or distinct processing steps are needed to achieve dehydrogenation and spheroidization. After exiting the plasma, the products cool and solidify, locking in the spherical shape and are then collected (265).

Figure 3:
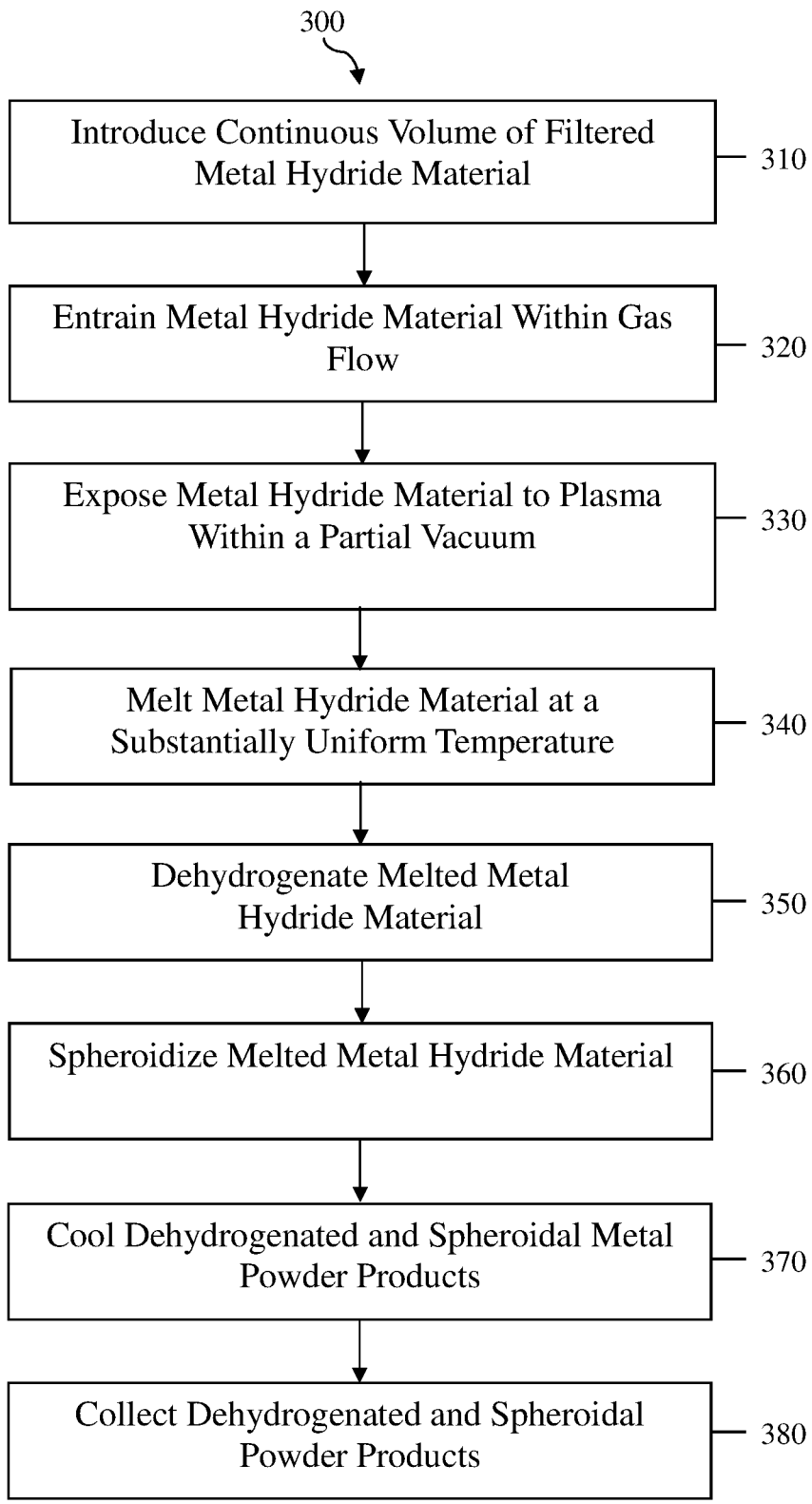
FIG. 3 illustrates another example method of producing dehydrogenated spheroidal particles from metal hydride material according to the present disclosure.

FIG. 3 is a flow chart illustrating another exemplary method (300) for producing spherical powders, according to another embodiment of the present disclosure. In this example, the method (300) begins by introducing a substantially continuous volume of filtered metal hydride feed materials into a plasma torch. As discussed above, the plasma torch can be a microwave generated plasma or an RF plasma torch (310). In one example embodiment, an AT-1200 rotating powder feeder (available from Thermach Inc.) allows a good control of the feed rate of the powder. In an alternative embodiment, the powder can be fed into the plasma using other suitable means, such as a fluidized bed feeder. The feed materials may be introduced at a constant rate, and the rate may be adjusted such that particles do not agglomerate during subsequent processing steps. In another exemplary embodiment, the feed materials to be processed are first sifted and classified according to their diameters, with a minimum diameter of 1 micrometers (μm) and a maximum diameter of 22 μm, or a minimum of 22 μm and a maximum of 44 μm, or a minimum of 44 μm and a maximum of 70 μm, or a minimum of 70 μm and a maximum of 106 μm, or a minimum of 106 μm and a maximum of 300 μm. As will be appreciated, these upper and lower values are provided for illustrative purposes only, and alternative size distribution values may be used in other embodiments. This eliminates recirculation of light particles above the hot zone of the plasma and also ensures that the process energy present in the plasma is sufficient to melt the particles without vaporization. Pre-screening allows efficient allocation of microwave power necessary to melt the particles without vaporizing material.

Once introduced into the microwave plasma torch, the feed materials can be entrained within an axis-symmetric laminar and/or turbulent flow toward a microwave or RF generated plasma (320). In exemplary embodiments, each particle within the process is entrained within an inert gas, such as argon. In some embodiments, the metal hydride materials are exposed to a partial vacuum within the plasma (330).

Within the plasma, the feed materials are exposed to a substantially uniform temperature profile and are melted (340). In one example, the feed materials are exposed to a uniform temperature profile of approximately between 4,000 and 8,000 K within the plasma. Melting the feed materials within the plasma brings hydrogen to the surface of the liquid metal hydride where it can leave the particle, thus rapidly dehydrogenating the particles (350). The $H_2$ acts as a reducing agent simultaneously deoxidizing the metal. Surface tension of the liquid metal shapes each particle into a spherical geometry (360). Thus, dehydrogenated, deoxidized, and spherical liquid metal particles are produced, which cool and solidify into dehydrogenated, deoxidized, and spherical metal powder products upon exiting the plasma (370). These particles can then be collected into bins (380). In some embodiments, the environment and/or sealing requirements of the bins are carefully controlled. That is, to prevent contamination or potential oxidation of the powders, the environment and or seals of the bins are tailored to the application. In one embodiment, the bins are under a vacuum. In one embodiment, the bins are hermetically sealed after being filled with powder generated in accordance with the present technology. In one embodiment, the bins are back filled with an inert gas, such as, for example argon. Because of the continuous nature of the process, once a bin is filled, it can be removed and replaced with an empty bin as needed without stopping the plasma process.

The methods and processes in accordance with the invention (e.g., 200, 250, 300) can be used to make spherical metal powders or spherical metal alloy powders. For example, if the starting feed material is a titanium hydride material, the resulting powder will be a spherical titanium powder. If the starting feed material is a titanium alloy hydride material, the resulting powder will be a spherical titanium alloy powder. In one embodiment that features the use of a starting titanium alloy hydride material, the resulting spherical titanium alloy powder comprises spherioidized particles of Ti Al6-V4, with between 4% to 7% weight aluminum and 3% to 5% weight vanadium.

Figure 4:
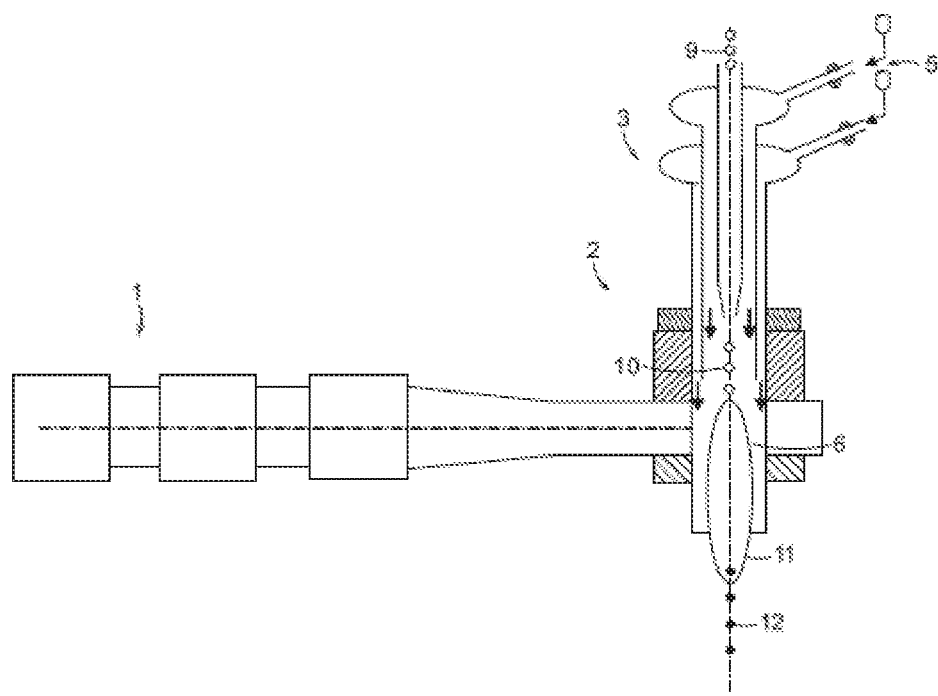
FIG. 4 illustrates an exemplary microwave plasma torch that can be used in the production of spheroidal and dehydrogenated metal or metal alloy powders, according to embodiments of the present disclosure.

FIG. 4 illustrates an exemplary microwave plasma torch that can be used in the production of spheroidal and dehydrogenated metal or metal alloy powders, according to embodiments of the present disclosure. As discussed above, metal hydride feed materials 9, 10 can be introduced into a microwave plasma torch 3, which sustains a microwave generated plasma 11. In one example embodiment, an entrainment gas flow and a sheath flow (downward arrows) may be injected through inlets 5 to create flow conditions within the plasma torch prior to ignition of the plasma 11 via microwave radiation source 1. In some embodiments, the entrainment flow and sheath flow are both axis-symmetric and laminar, while in other embodiments the gas flows are swirling. The feed materials 9 are introduced axially into the microwave plasma torch, where they are entrained by a gas flow that directs the materials toward the plasma. As discussed above, the gas flows can consist of a noble gas column of the periodic table, such as helium, neon, argon, etc. Within the microwave generated plasma, the feed materials are melted, as discussed above, in order to dehydrogenate, deoxidize and spheroidize the materials. Inlets 5 can be used to introduce process gases to entrain and accelerate particles 9, 10 along axis 12 towards plasma 11. First, particles 9 are accelerated by entrainment using a core laminar gas flow (upper set of arrows) created through an annular gap within the plasma torch. A second laminar flow (lower set of arrows) can be created through a second annular gap to provide laminar sheathing for the inside wall of dielectric torch 3 to protect it from melting due to heat radiation from plasma 11. In exemplary embodiments, the laminar flows direct particles 9, 10 toward the plasma 11 along a path as close as possible to axis 12, exposing them to a substantially uniform temperature within the plasma. In some embodiments, suitable flow conditions are present to keep particles 10 from reaching the inner wall of the plasma torch 3 where plasma attachment could take place. Particles 9, 10 are guided by the gas flows towards microwave plasma 11 were each undergoes homogeneous thermal treatment. Various parameters of the microwave generated plasma, as well as particle parameters, may be adjusted in order to achieve desired results. These parameters may include microwave power, feed material size, feed material insertion rate, gas flow rates, plasma temperature, and cooling rates. In some embodiments, the cooling or quenching rate is not less than $10^{+3}$ degrees C./sec upon exiting plasma 11. As discussed above, in this particular embodiment, the gas flows are laminar; however, in alternative embodiments, swirl flows or turbulent flows may be used to direct the feed materials toward the plasma.

In describing exemplary embodiments, specific terminology is used for the sake of clarity and in some cases reference to a figure. For purposes of description, each specific term is intended to at least include all technical and functional equivalents that operate in a similar manner to accomplish a similar purpose. Additionally, in some instances where a particular exemplary embodiment includes a plurality of system elements, device components or method steps, those elements, components or steps may be replaced with a single element, component or step. Likewise, a single element, component or step may be replaced with a plurality of elements, components or steps that serve the same purpose. Moreover, while exemplary embodiments have been shown and described with references to particular embodiments thereof, those of ordinary skill in the art will understand that various substitutions and alterations in form and detail may be made therein without departing from the scope of the invention. Further still, other functions and advantages are also within the scope of the invention.

What is claimed is:

1. Dehydrogenated and spheroidized particles prepared by a process comprising:
   introducing a titanium hydride feed material into a plasma torch;
   melting, dehydrogenating, and spheroidizing the feed material within the plasma to form dehydrogenated and spheroidized titanium particles;
   exposing the dehydrogenated and spheroidized particles to an inert gas; and cooling and solidifying the dehydrogenated and spheroidized particles in a chamber having the inert gas, the dehydrogenated and spheroidized particles having more than 90% spheroidization consistency, wherein the solidified dehydrogenated and spheroidized particles comprise spheroidized titanium powder particles having a martensitic microstructure.

2. The particles of claim 1, wherein the dehydrogenated and spheroidized particles are further deoxidized within the plasma.

3. The particles of claim 1, wherein the feed material is exposed to a temperature profile between about 4,000 K and 8,000 K within the plasma.

4. The particles of claim 1, wherein the feed material is exposed to a partial vacuum within the plasma.

5. The particles of claim 1, wherein the feed material is exposed to a pressure greater than atmospheric pressure within the plasma.

6. The particles of claim 1, wherein a particle size of the feed material is no less than 1.0 micrometers and no more than 300 micrometers.

7. The particles of claim 1, wherein the hydride feed material is continuously introduced into the plasma.

8. The particles of claim 1, wherein the hydride feed material is purged with an inert gas prior to introducing the hydride feed material into the plasma torch.

9. The particles of claim 1, wherein the plasma torch comprises a microwave generated plasma torch.

10. A method of producing dehydrogenated and spheroidized particles comprising:

introducing a titanium hydride feed material into a plasma torch;

directing the feed material toward a plasma within the plasma torch;

melting, dehydrogenating and spheroidizing the feed material within the plasma to form dehydrogenated and spheroidized titanium particles;

exposing the dehydrogenated and spheroidized particles to an inert gas; and cooling and solidifying the dehydrogenated and spheroidized particles in the chamber having the inert gas, the dehydrogenated and spheroidized particles having more than 90% spheroidization consistency, wherein the solidified dehydrogenated and spheroidized particles comprise spheroidized titanium powder particles having a martensitic microstructure; and collecting the dehydrogenated and spheroidized particles.

11. The method of claim 10, further comprising deoxidizing the feed material within the plasma.

12. The method of claim 10, wherein the plasma exposes the feed material to a temperature profile between about 4,000 K and 8,000 K.

13. The method of claim 10, further comprising exposing the feed material to a partial vacuum while the feed material is exposed to the plasma.

14. The method of claim 10, further comprising exposing the feed material to a pressure higher than atmospheric pressure while the feed material is exposed to the plasma.

15. The method of claim 10, further comprising: screening the feed material prior to introducing the feed material into the plasma torch; and maintaining an average particle size distribution from the feed material to the dehydrogenated and spheroidized particles.

16. The method of claim 15, wherein the particle size of feed material is no less than 1.0 micrometers and no more than 300 micrometers.

17. The method of claim 10, further comprising purging the hydride feed material with an inert gas to remove oxygen prior to introducing the hydride feed material into the plasma torch.

18. The method of claim 10, wherein the plasma torch is a microwave generated plasma torch.

* * * * *